United States Patent
Chan et al.

(10) Patent No.: US 10,826,541 B2
(45) Date of Patent: Nov. 3, 2020

(54) CONVOLUTIONAL CODE DECODER AND CONVOLUTIONAL CODE DECODING METHOD

(71) Applicant: REALTEK SEMICONDUCTOR CORPORATION, Hsinchu (TW)

(72) Inventors: Kuei-Cheng Chan, Hsinchu County (TW); Chung-Yao Chang, Hsinchu County (TW); Wei-Chieh Huang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/442,604

(22) Filed: Jun. 17, 2019

(65) Prior Publication Data
US 2020/0028526 A1 Jan. 23, 2020

(30) Foreign Application Priority Data
Jul. 19, 2018 (TW) .............................. 107124892 A

(51) Int. Cl.
*H03M 13/03* (2006.01)
*H03M 13/41* (2006.01)
(Continued)

(52) U.S. Cl.
CPC ....... *H03M 13/4169* (2013.01); *H03M 13/29* (2013.01); *H03M 13/6318* (2013.01); *H03M 13/6343* (2013.01)

(58) Field of Classification Search
CPC ............. H03M 13/4169; H03M 13/29; H03M 13/6343; H03M 13/6318
See application file for complete search history.

(56) References Cited

U.S. PATENT DOCUMENTS

2002/0075966 A1* 6/2002 Mikkola ............... H04L 1/0054
375/262
2003/0056158 A1* 3/2003 Yue ......................... H04L 1/208
714/704
(Continued)

OTHER PUBLICATIONS

Chao-Yuan Hsu, "Network data prediction method, network data processing device and network data processing method", U.S. Appl. No. 16/251,685, filed Jan. 18, 2019.

*Primary Examiner* — Samir W Rizk
(74) *Attorney, Agent, or Firm* — WPAT, PC

(57) ABSTRACT

The invention discloses a convolutional code decoder and a convolutional code decoding method. The convolutional code decoder performs decoding operation according to a received data and an auxiliary data to obtain a target data and includes an error detection data generation circuit, a channel coding circuit, a selection circuit, and a Viterbi decoding circuit. The error detection data generation circuit performs an error detection operation on the auxiliary data to obtain an error detection data. The channel coding circuit, coupled to the error detection data generation circuit, performs channel coding on the auxiliary data and the error detection data to obtain an intermediate data. The selection circuit, coupled to the channel coding circuit, generates a to-be-decoded data according to the received data and the intermediate data. The Viterbi decoding circuit, coupled to the selection circuit, decodes the to-be-decoded data to obtain the target data.

16 Claims, 10 Drawing Sheets

(51) Int. Cl.
*H03M 13/29* (2006.01)
*H03M 13/00* (2006.01)

(56) References Cited

U.S. PATENT DOCUMENTS

| | | | | |
|---|---|---|---|---|
| 2005/0286459 A1* | 12/2005 | Roh | ............... | H04L 1/0068 370/321 |
| 2009/0128378 A1* | 5/2009 | Cideciyan | ......... | G11B 20/1426 341/59 |
| 2020/0028525 A1* | 1/2020 | Chan | ............... | H04L 1/0059 |

* cited by examiner

CONVOLUTIONAL CODE DECODER AND CONVOLUTIONAL CODE DECODING METHOD

BACKGROUND OF THE INVENTION

1. Field of the Invention

The present invention relates to wireless communication systems, and, more particularly, to decoders and decoding methods for wireless communication systems.

2. Description of Related Art

As low power consumption has been more and more important in Low-Power Wide-Area Network (LPWAN), various product makers have been attempting in recent years to achieve coverage enhancement under a limited system resource. Driven by the market, the concept of the Internet of Things (IoT) is becoming more mature. A large number of devices need to be connected to the network, and some of which require only a small amount of data transmission but a long waiting time. Because these devices are designed to possess low energy consumption, low complexity, low cost, high coverage, and other characteristics, and there is a good change that these devices operate in an environment in which the signal-to-noise ratio (SNR) is poor (e.g., operate in the cell edge or basement), the transmitting end (e.g., the base station) repeatedly transmits the signals in an effort to help the receiver to correctly decode the signals. In order to effectively improve the demodulation accuracy, the receiving end must spend a long time waiting and receive these repeatedly transmitted signals. However, this extended computing time increases power consumption.

Therefore, it becomes an important issue to improve the bit error rate (BER) performance at the receiving end to thereby reduce power consumption and costs and increase the service life of the battery.

SUMMARY OF THE INVENTION

In view of the issues of the prior art, an object of the present invention is to provide a convolutional code decoder and a convolutional code decoding method, so as to make an improvement to the prior art.

A convolutional code decoder is provided. The convolutional code decoder performs decoding to obtain a target data according to a received data and an auxiliary data. The convolutional code decoder includes an error detection data generation circuit, a channel coding circuit, a selection circuit, and a Viterbi decoding circuit. The error detection data generation circuit is configured to perform an error detection operation on the auxiliary data to obtain an error detection data. The channel coding circuit is coupled to the error detection data generation circuit and configured to perform channel coding on the auxiliary data and the error detection data to obtain an intermediate data. The selection circuit is coupled to the channel coding circuit and configured to generate a to-be-decoded data according to the received data and the intermediate data. The Viterbi decoding circuit is coupled to the selection circuit and configured to decode the to-be-decoded data to obtain the target data.

A convolutional code decoding method is also provided. The convolutional code decoding method performs decoding to obtain a target data according to a received data and an auxiliary data. The convolutional code decoding method includes the following steps: performing an error detection operation on the auxiliary data to obtain an error detection data; performing channel coding on the auxiliary data and the error detection data to obtain an intermediate data; generating a to-be-decoded data according to the received data and the intermediate data; and decoding the to-be-decoded data by performing the Viterbi decoding operation to thereby obtain the target data.

A convolutional code decoder is also provided. The convolutional code decoder performs decoding to obtain a target data according to a received data and an auxiliary data. The convolutional code decoder includes an error detection data generation circuit, a channel coding circuit, a selection circuit, and a Viterbi decoding circuit. The error detection data generation circuit is configured to perform an error detection operation on the auxiliary data to obtain an error detection data. The channel coding circuit is coupled to the error detection data generation circuit and configured to perform channel coding on the auxiliary data and the error detection data to obtain an intermediate data. The selection circuit is coupled to the channel coding circuit and configured to generate a to-be-decoded data according to the received data and the intermediate data. The Viterbi decoding circuit is coupled to the selection circuit and configured to decode the to-be-decoded data by referring to the auxiliary data to obtain the target data.

A convolutional code decoding method is also provided. The convolutional code decoding method performs decoding to obtain a target data according to a received data and an auxiliary data. The convolutional code decoding method includes the following steps: performing an error detection operation on the auxiliary data to obtain an error detection data; performing channel coding on the auxiliary data and the error detection data to obtain an intermediate data; generating a to-be-decoded data according to the received data and the intermediate data; decoding the to-be-decoded data by performing the Viterbi decoding operation and referring to the auxiliary data to thereby obtain the target data.

The convolutional code decoder and the convolutional code decoding method of the present invention use predicted data to decode. Compared with the conventional technology, the convolutional code decoder and the convolutional code decoding method of the present invention can demodulate/decode signals more quickly. One of advantages of early completion of the demodulation/decoding process is early termination of the operation state, which can save power.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

Figure 1:
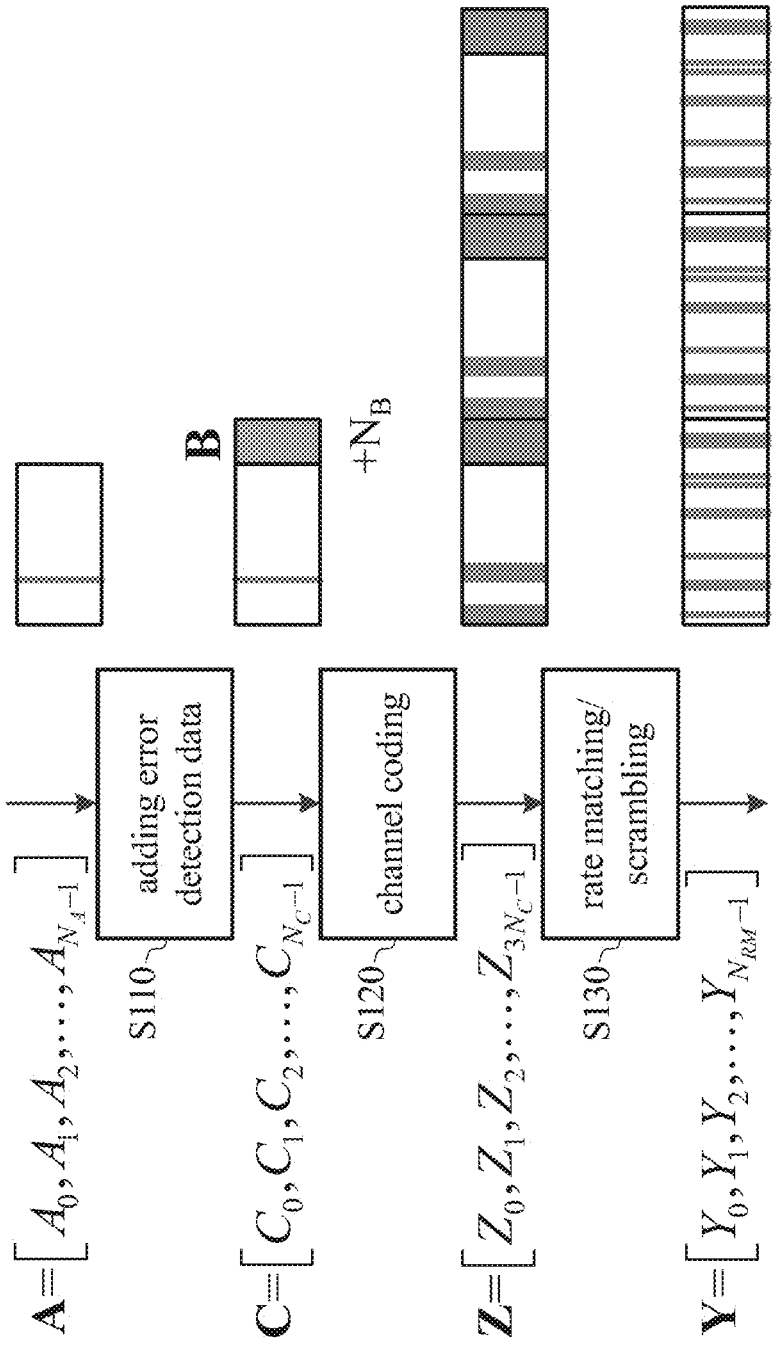
FIG. 1 illustrates a diagram showing the process and data structure of the modulation and/or encoding of data in a wireless communication system.

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes convolutional code decoders and convolutional code decoding methods. On account of that some or all elements of the convolutional code decoders could be known, the detail of such elements is omitted provided that such detail has little to do with the features of this disclosure and this omission nowhere dissatisfies the specification and enablement requirements. Some or all of the processes of the convolutional code decoding methods may be implemented by software and/or firmware, and can be performed by the convolutional code decoders or their equivalents. A person having ordinary skill in the art can choose components or steps equivalent to those described in this specification to carry out the present invention, which means that the scope of this invention is not limited to the embodiments in the specification.

The following description of the Viterbi architecture is based on (2,1,2) convolutional code encoding and hard decision. Those skilled in the art, however, may apply this invention to different types of convolutional coding and soft decision after having an understanding of the embodiments of the invention.

In this invention, the demodulation and/or decoding scheme of the receiving end is suitable for a communication system based on a general modulation technique, such as a communication system using a convolutional code encoder/decoder. Such communication systems can be, for example, the Internet of Things (IoT), machine-to-machine (M2M) systems, 802.11ah HaLow of Wireless Fidelity (Wi-Fi), etc. The following description is based on a narrow band IoT (NB-IoT) receiver, but the present invention is not limited to this communication system.

In network systems, during data transmission, needs for transmitting repeated data are common, or partially identical (thus predictable) and partially unknown data are transmitted, but all data must be processed together in the demodulation process, resulting in some unnecessary errors and the increase of unnecessary power consumption. The present invention therefore provides a scheme that utilizes known data to facilitate the demodulation and/or decoding process(s). These known data can be obtained by the receiving end's prediction for the value(s) of certain bit(s) of the current signal based on statistics and analysis of previously transmitted data over a relatively long period of time. The method for generating these known data can be referred, but not limited, to U.S. patent application Ser. No. 16/251,685.

FIG. 1 is a diagram showing the process and data structure of the modulation and/or encoding of data in a wireless communication system. The original data A is a vector whose length (number of bits) is $N_A \times 1$. After going through step S110 in which the error detection data (e.g., cyclic redundancy check (hereinafter referred to as CRC)) are added, the original data A becomes the data C, a vector whose length is $N_C \times 1$. As shown in FIG. 1, in step S110, the error detection data B (redundancy bit(s)) of length $N_B$ is added to the end of the original data A to form the data C (i.e., $N_C = N_A + N_B$). The error detection data B of length $N_B$ is used for verifying the correctness of the original data A. In step S120, the data C is channel-coded to overcome the channel effect. It is assumed here that the channel coding is a Tail-Biting Convolutional Code (TBCC) of ⅓ code rate, and after the encoding, the data Z, a vector of length $3N_C \times 1$, is generated. Finally, in step S130, the data Z is subjected to rate matching and/or scrambling to distribute the data evenly to all available resource elements (REs) to thereby form a modulated/encoded data Y (a vector of length $N_{RM} \times 1$) to be transmitted.

Since the CRC-based error detection data B is associated with all bits of the original data A, when the original data A has one or several unknown bit(s) (marked in gray), the error detection data B (the last $N_B$ bits of the data C) are considered unknown bits (also marked in gray). Next, unknown bits are increased in the data Z owing to the properties of the convolutional code; the number of unknown bits is related to the code rate and the constraint length of the convolutional code. Rate matching and scrambling do not change the ratio of the number of unknown bits to the number of known bits but affect the positions of the unknown bits in the data Y to be transmitted.

Figure 2:
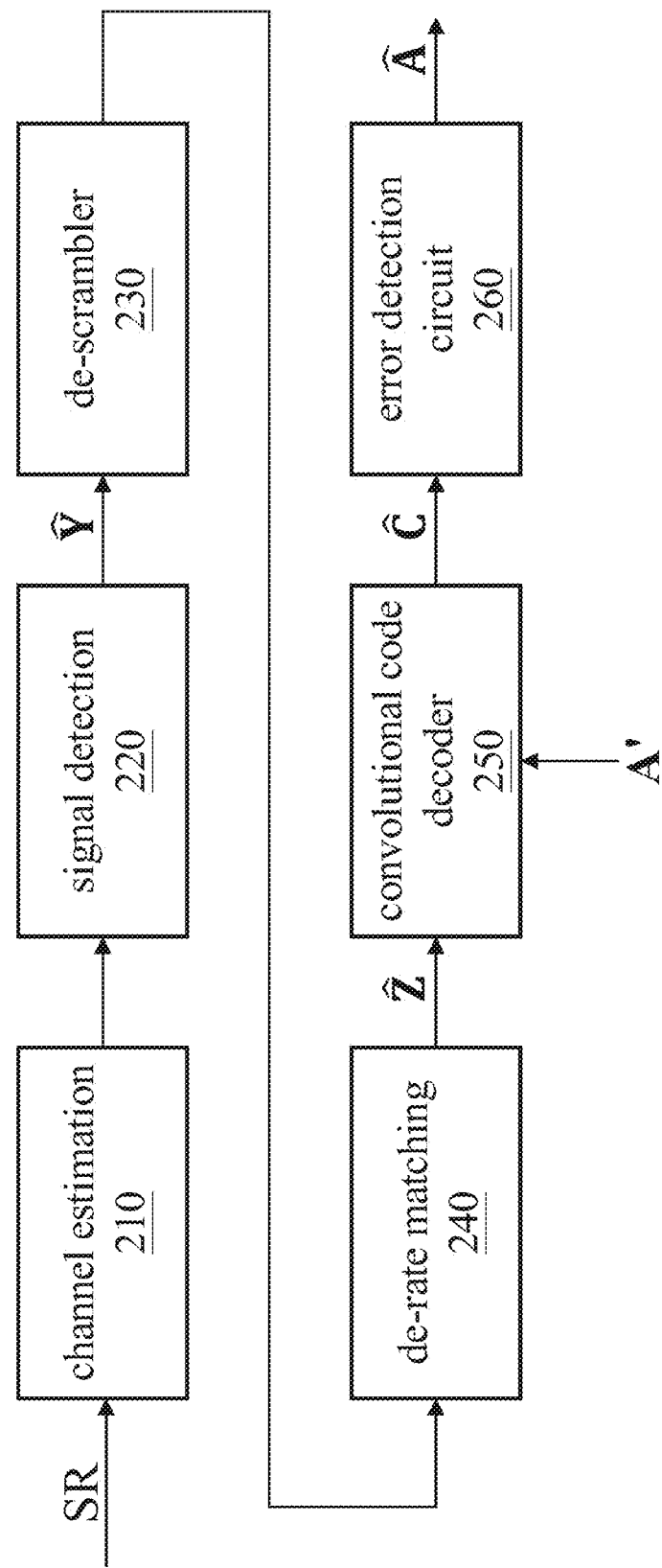
FIG. 2 illustrates a functional block diagram of a demodulation/decoding apparatus at a wireless communication receiving end according to one aspect of the present invention.

FIG. 2 is a functional block diagram of a demodulation/decoding apparatus at a wireless communication receiving end according to one aspect of the present invention. Channel estimation 210 compensates for the channel effect on the received signal SR. The repeating properties between different subframes can be combined to improve the signal-to-noise ratio. The main function of the signal detection 220 is to demodulate. Next, after all the resource elements of a Narrowband Physical Downlink Shared Channel (NPDSCH) are arranged, an estimated data $\hat{Y}$ can be obtained. After the estimated data $\hat{Y}$ is processed by the de-scrambler 230 and the de-rate matching 240, the received data $\hat{Z}$ (a vector of length $N_{TB} = 3N_C \times 1$) can be obtained. The convolutional code decoder 250 decodes the received data $\hat{Z}$ by referring to the auxiliary data A' to thereby output the target data $\hat{C}$, which is the estimate of the data C. The target data $\hat{C}$ includes the estimated data $\hat{A}$ and the intermediate error detection data $\hat{B}_{dec}$, the estimated data $\hat{A}$ being an estimate of the original data A. The error detection circuit 260 refers to the intermediate error detection data $\hat{B}_{dec}$ to determine whether the estimated data $\hat{A}$ is a valid codeword. Once determined to be valid, the estimated data $\hat{A}$ is considered to be equal to the original data A.

Figure 3:
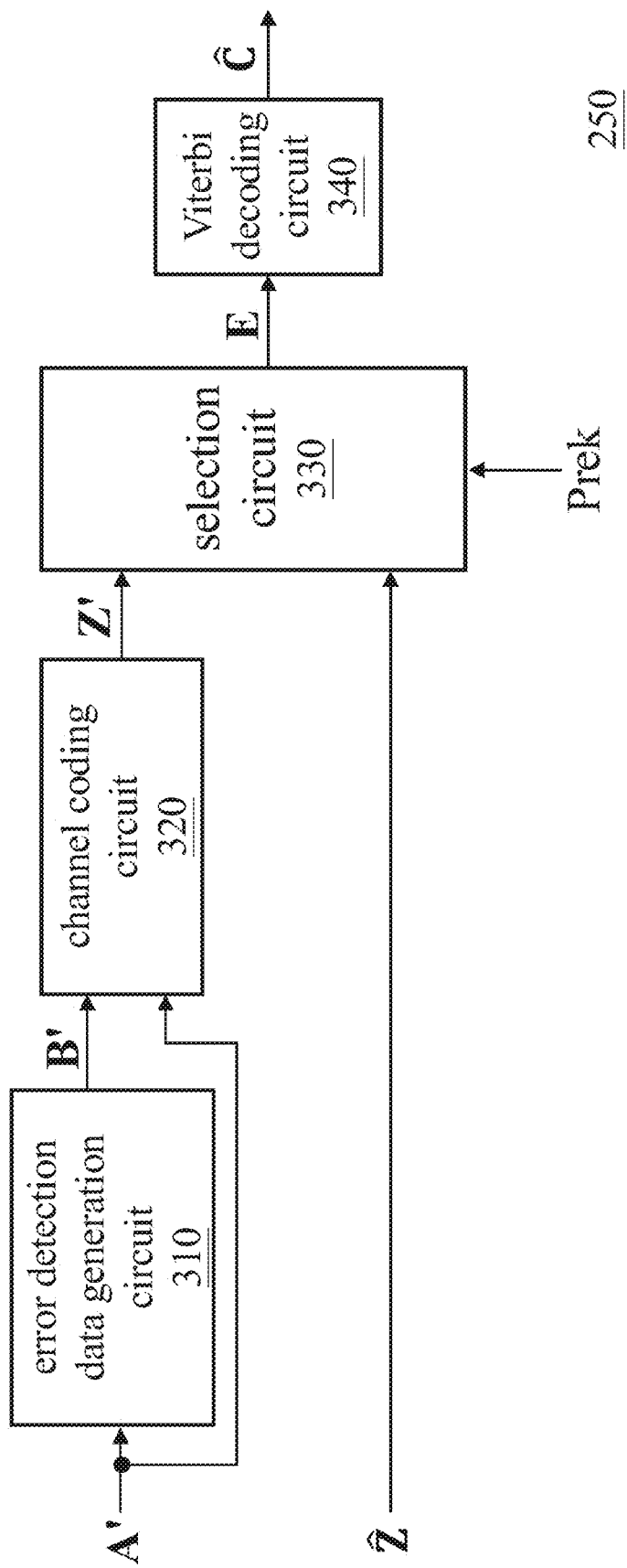
FIG. 3 illustrates a functional block diagram of a convolutional code decoder according to an embodiment of the present invention.
Figure 4:
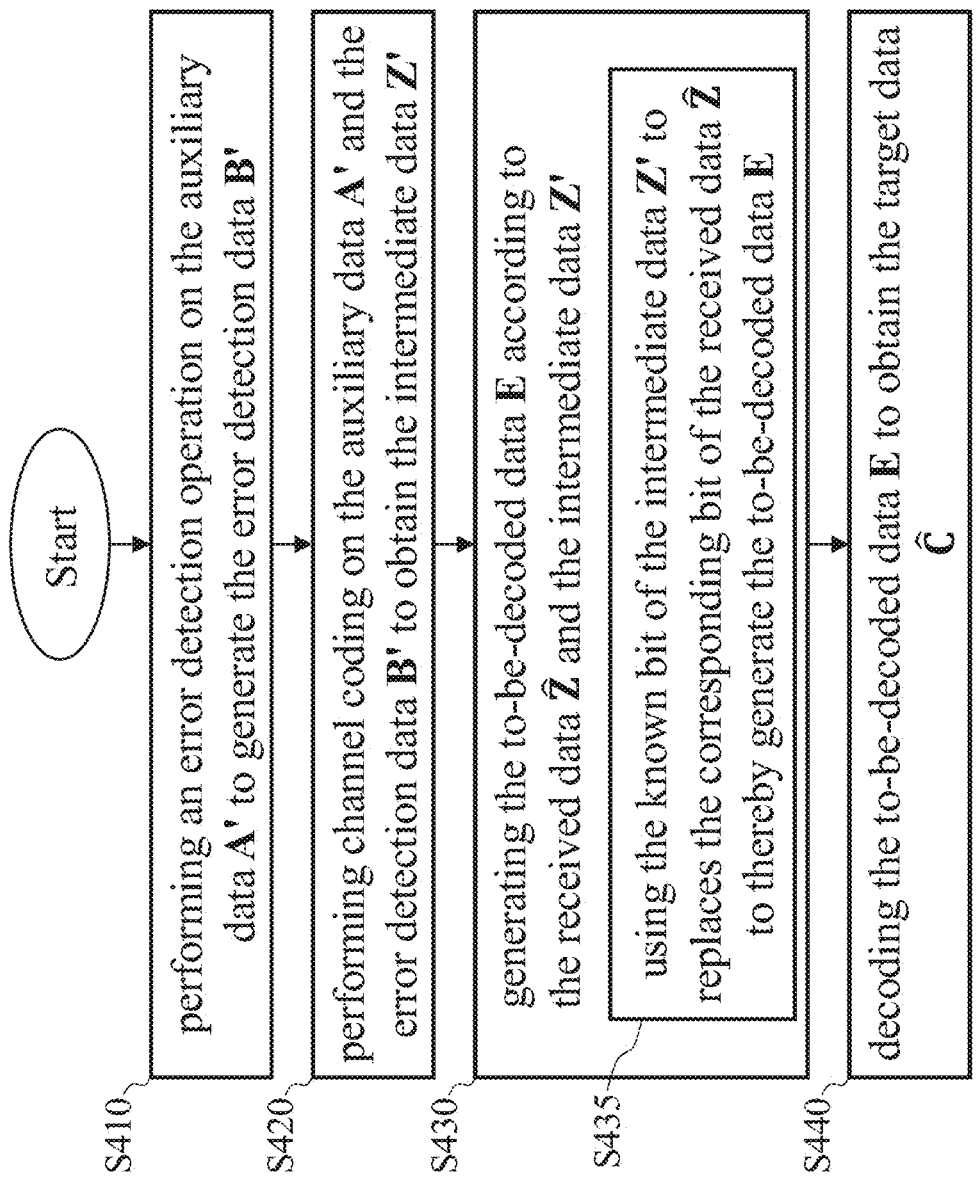
FIG. 4 illustrates a flowchart of a convolutional code decoding method according to an embodiment of the present invention.

The Viterbi algorithm is extensively used in convolutional code decoding. FIG. 3 is a functional block diagram of a convolutional code decoder according to an embodiment of the present invention. FIG. 4 is a flowchart of a convolutional code decoding method according to an embodiment of the present invention. The convolutional code decoder 250 includes an error detection data generation circuit 310, a channel coding circuit 320, a selection circuit 330, and a Viterbi decoding circuit 340. First, the error detection data generation circuit 310 performs an error detection operation on the auxiliary data A' to generate the error detection data B' (step S410). For example, the error detection data generation circuit 310 can perform the cyclic redundancy check (CRC) operation on the auxiliary data A' to generate the error detection data B'. For NB-IoT, the error detection data B' can be a 24-bit CRC code. Then, the channel coding circuit 320 performs channel coding on the auxiliary data A' and the error detection data B' to obtain the intermediate data Z' (step S420). The channel coding circuit 320 performs channel coding using the coding scheme that is the same as the coding scheme adopted by the transmitting end (for example, the convolutional coding). The auxiliary data A' is the predicted data for the original data A, meaning that the auxiliary data A' is substantially the same in length as the original data A, and that the auxiliary data A' contains all or part of the bits of the original data A. That is to say, when the prediction is correct, the known bit(s) (i.e., the predicted bit(s)) of the auxiliary data A' is/are the same as the corresponding bit(s) of the original data A. Since the auxiliary data A' has substantially the same length as the original data A, the intermediate data Z' is substantially the same in length as the received data Z. At least one bit of the auxiliary data A' is known (predicted), while other bit(s) (if any) is/are unknown (not predicted). When all bits in the auxiliary data A' are known, all bits in the error detection data B' and intermediate data Z' are also known. When there is an unknown bit in the auxiliary data A', all bits in the error detection data B' are unknown, and the bits in the intermediate data Z' are partially known and partially unknown. Next, the selection circuit 330 generates the to-be-decoded data E according to the received data Z and the intermediate data Z' (step S430). The control signal Prek indicates whether the bit of the intermediate data Z' currently inputted into the selection circuit 330 is a known bit or an unknown bit. Step S430 includes sub-step S435, in which the selection circuit 330 uses the known bit of the intermediate data Z' to replace the corresponding bit of the received data Z according to the control signal Prek to thereby generate the to-be-decoded data E. That is to say, after the selection circuit 330, certain bit(s) of the received data Z (corresponding to the known bit(s) of the intermediate data Z') is/are replaced by the corresponding bit(s) of the intermediate data Z', and other bit(s) (corresponding to the unknown bit(s) of the intermediate data Z') remain(s) unchanged. In some embodiments, when the to-be-decoded data E is a soft value, the selection circuit 330 and step S435 further include the operation of converting the known bit(s) into an extremum. Finally, the Viterbi decoding circuit 340 decodes the to-be-decoded data E using the Viterbi algorithm to obtain the target data Ĉ (step S440). The selection circuit 330 can be implemented with a multiplexer.

Because some or all of the bits of the to-be-decoded data E are known (in comparison, all bits of the received data Ẑ are unknown, that is, whether the bit values of the received data Ẑ are correct is undetermined), the Viterbi decoding circuit 340 can generate the target data Ĉ more accurately. Therefore, the convolutional code decoder 250 of the present invention has good performance. As a result, the demodulation and/or decoding time at the receiving end in the wireless communication system can be shortened, thereby reducing power consumption of the wireless devices.

Figure 5:
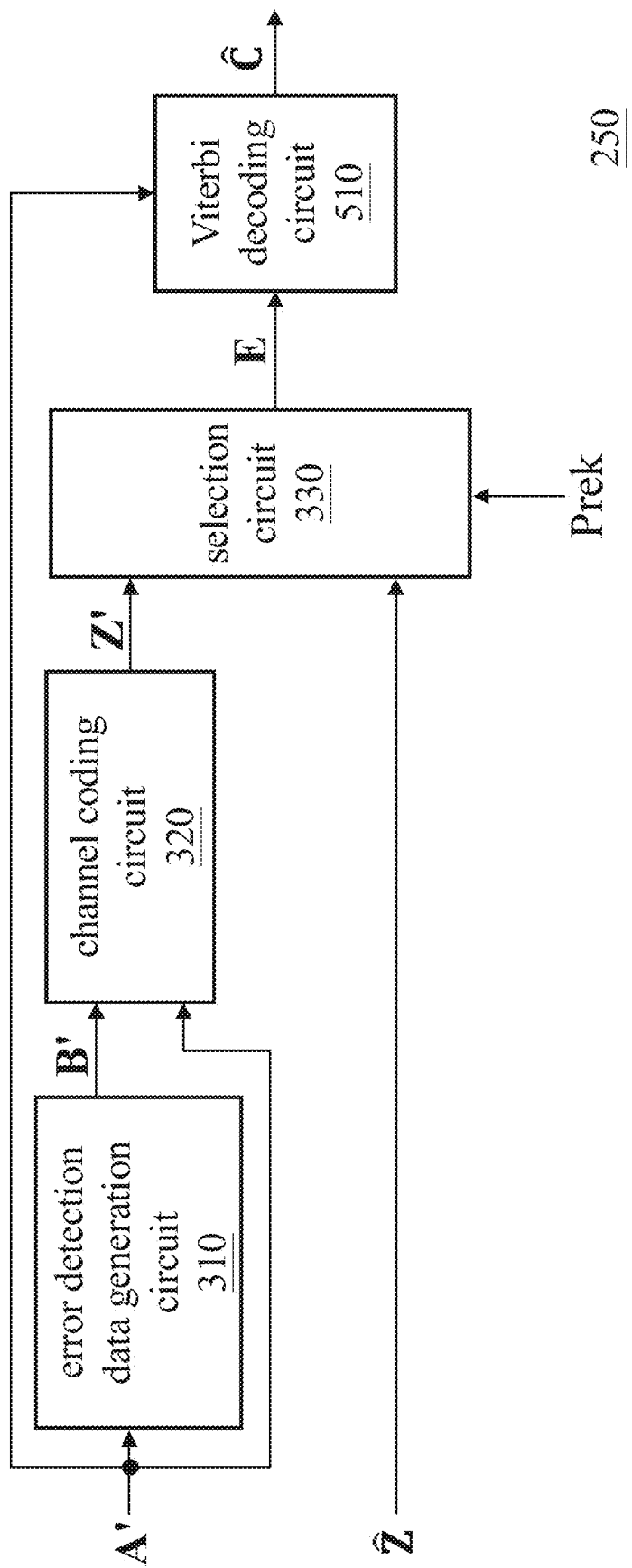
FIG. 5 illustrates a functional block diagram of a convolutional code decoder according to another embodiment of the present invention.
Figure 6:
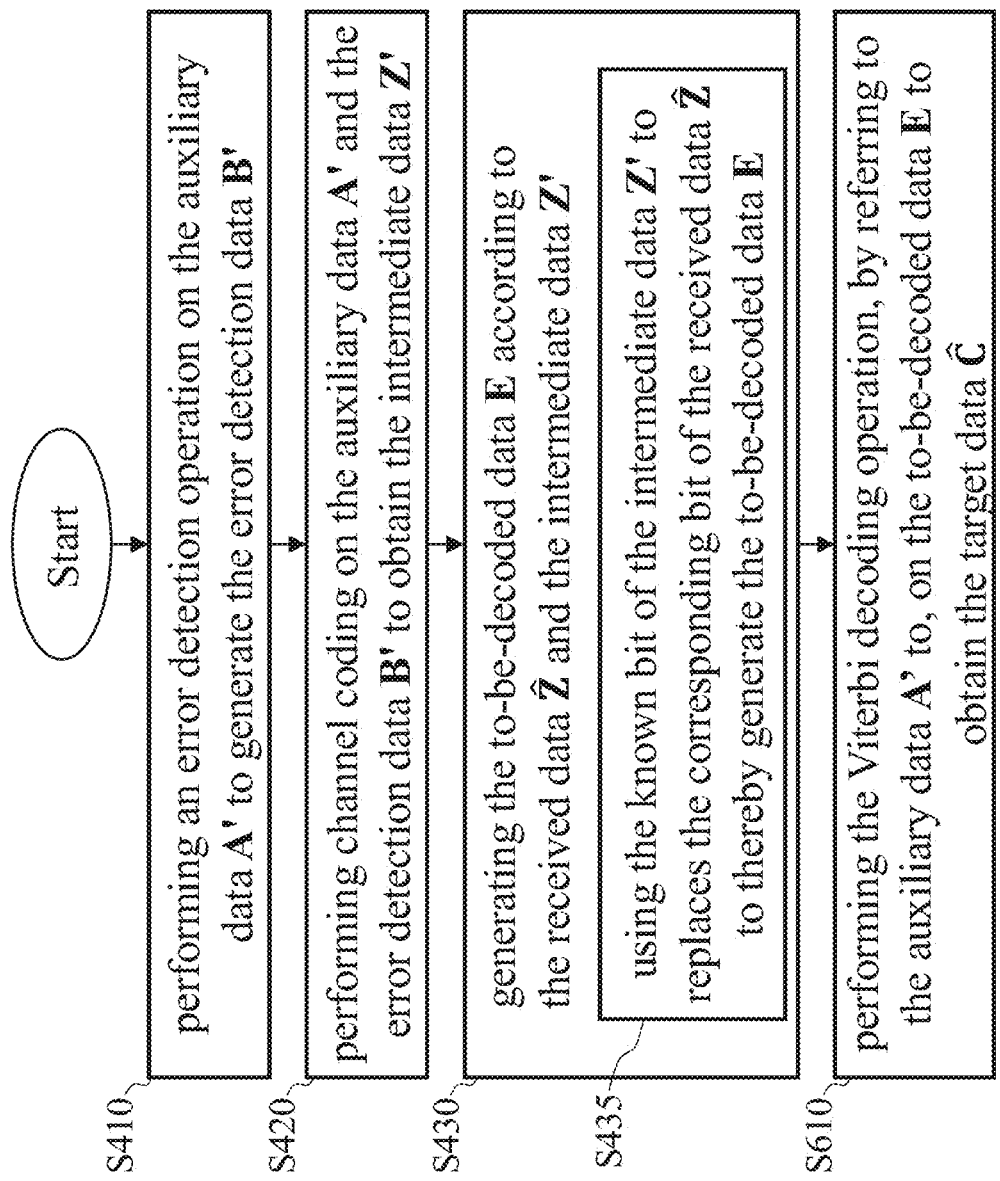
FIG. 6 illustrates a flowchart of a convolutional code decoding method according to another embodiment of the present invention.

FIG. 5 is a functional block diagram of a convolutional code decoder according to another embodiment of the present invention. FIG. 6 is a flowchart of a convolutional code decoding method according to another embodiment of the present invention. The convolutional code decoder 250 includes the error detection data generation circuit 310, the channel coding circuit 320, the selection circuit 330, and a Viterbi decoding circuit 510. The error detection data generation circuit 310, the channel coding circuit 320 and the selection circuit 330 of FIG. 5 and the steps S410 to S435 of FIG. 6 were thoroughly described in the discussions of FIG. 3 and FIG. 4, and repeated descriptions are thus omitted for brevity. In this embodiment, the Viterbi decoding circuit 510 refers to the auxiliary data A' to perform the Viterbi decoding operation on the to-be-decoded data E to obtain the target data Ĉ (step S610). The Viterbi decoding circuit 340 of FIG. 3 conducts calculations and determinations for all the branches in the Viterbi algorithm, whereas the Viterbi decoding circuit 510 of FIG. 5, with the aid of the pre-known bit(s), excludes or eliminates in advance the wrong branch(es), which will not be selected. Therefore, the Viterbi decoding circuit 510 is more efficient and has better performance than the Viterbi decoding circuit 340.

Figure 7:
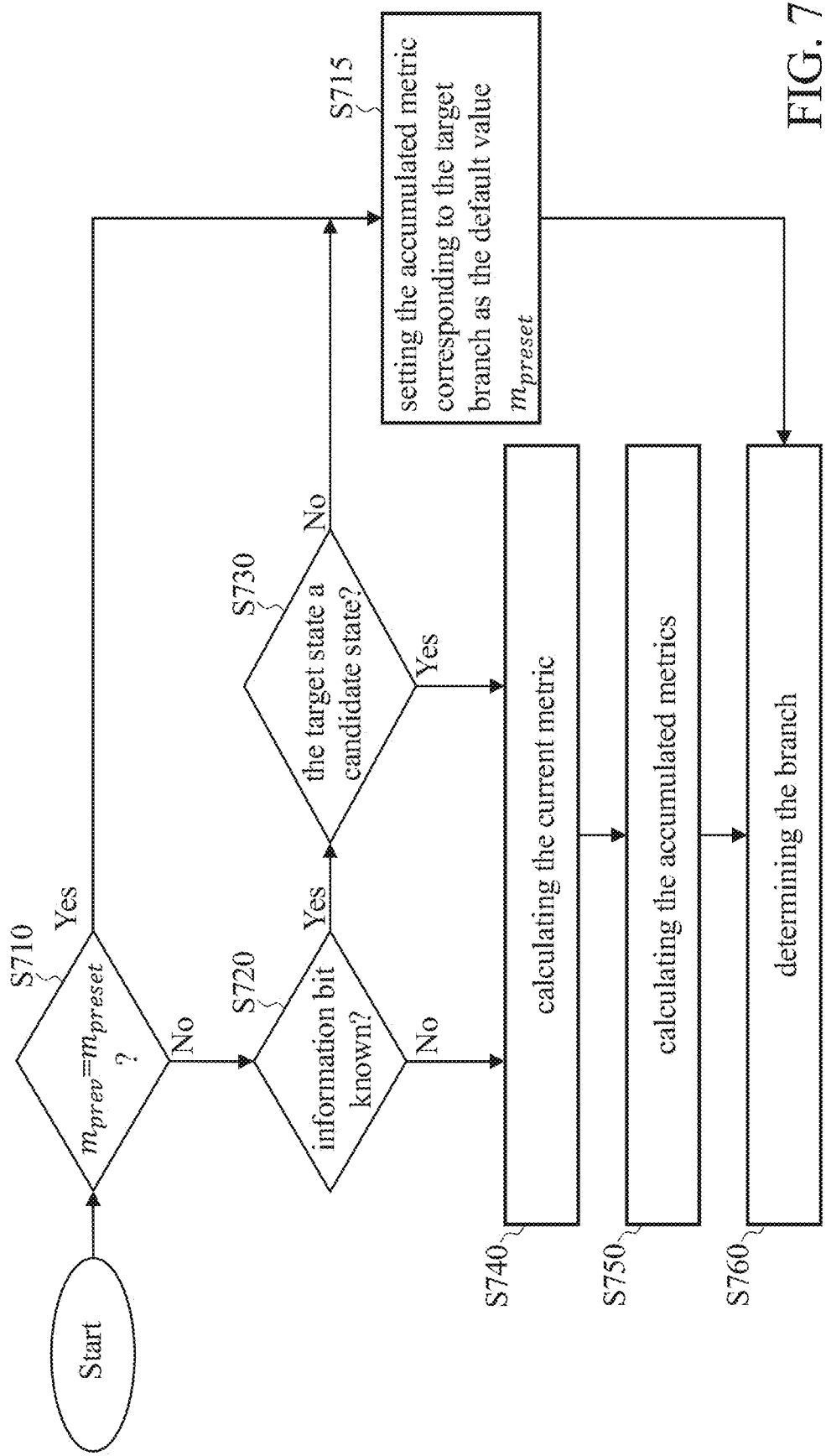
FIG. 7 illustrates a flowchart that shows the sub-steps of step S610.
Figure 8:
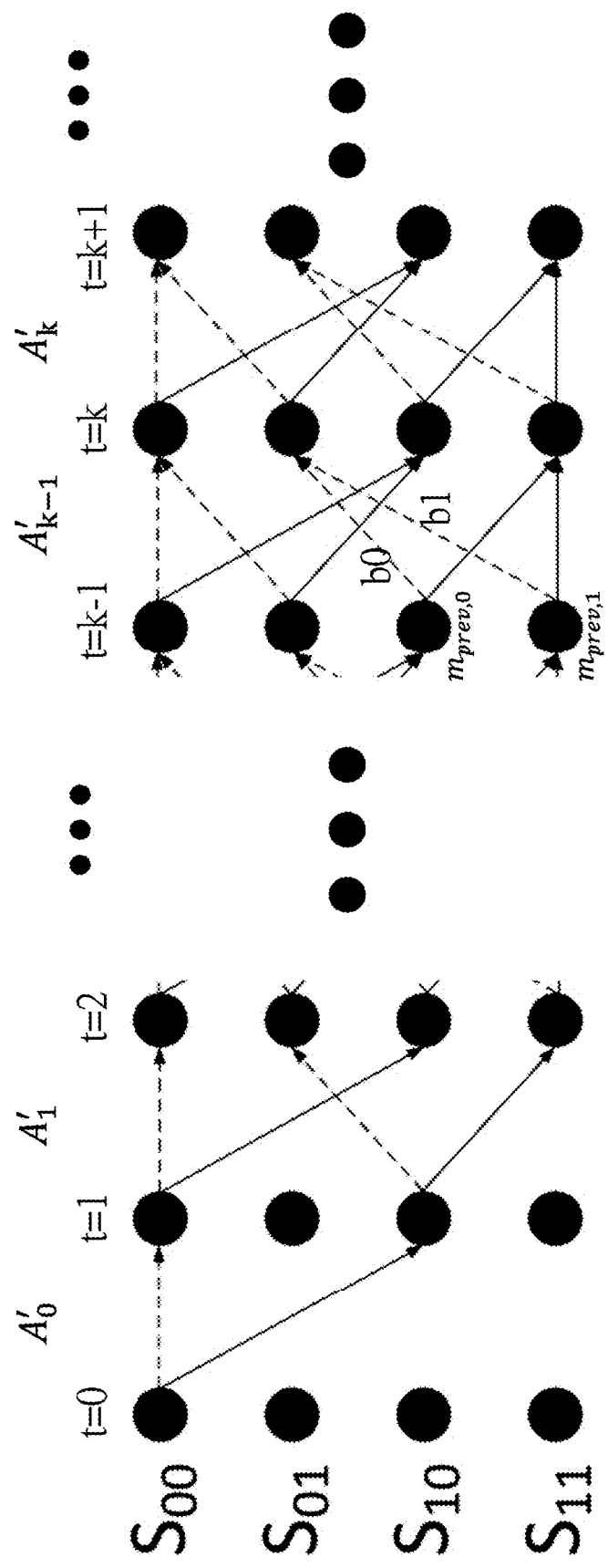
FIG. 8 illustrates a diagram illustrative of the Viterbi algorithm.

FIG. 7 is a flowchart that shows the sub-steps of step S610. FIG. 8 is a diagram illustrative of the Viterbi algorithm. FIG. 8 is an illustration of the (2, 1, 2) convolutional code and is intended to illustrate the invention by way of examples, rather than to limit the scope of the claimed invention. As shown in FIG. 8, there are four states ($S_{00}$, $S_{01}$, $S_{10}$, $S_{11}$) that the Viterbi decoding circuit 510 processes in each stage (t=0, 1, 2, ..., k−1, k, k+1, ..., k being a positive integer and t=0 being the initial stage). When processing the target state of a certain stage (e.g., the state $S_{01}$ of stage k), the Viterbi decoding circuit 510 first finds two branches connected to the target state (i.e., the two branches b0 and b1 entering the target state $S_{01}$) and determines whether the previously accumulated metric $m_{prev}$ corresponding to each branch is a default value $m_{preset}$ (step S710). Each branch has a current metric. The method for calculating the current metrics is well known to those of ordinary skill in the art and is thus omitted for brevity. The accumulated metric $m_{accu,0}$ corresponding to the branch b0 and the accumulated metric $m_{accum,1}$ corresponding to the branch b1 can be calculated by the following equations (1) and (2), respectively.

$$m_{accum,0} = m_{prev,0} + m_{cur,0} \quad (1)$$

$$m_{accum,1} = m_{prev,1} + m_{cur,1} \quad (2)$$

where $m_{cur,0}$ and $m_{cur,1}$ are the current metrics corresponding to branch b0 and branch b1, respectively, and $m_{prev,0}$ and $m_{prev,1}$ are previously accumulated metrics corresponding to branch b0 and branch b1, respectively.

The default value $m_{preset}$ is related to how the Viterbi decoding circuit 510 determines the branch (step S760). In step S760, the Viterbi decoding circuit 510 selects one of the two branches of the target state as the survivor path, records the source of the selected branch (e.g., using a bit 0 or bit 1 to indicate the source), and finally updates the previously accumulated metric of the next stage with the accumulated metric. If the default value $m_{preset}$ is a maximum value (e.g., $+2^{N-1}$, N being the number of bits of the default value $m_{preset}$), the Viterbi decoding circuit 510 selects in step S760 a branch having a smaller accumulated metric. Alternatively, if the default value $m_{preset}$ is a minimum value (e.g., $-2^{N-1}$), the Viterbi decoding circuit 510 selects in step S760 a branch having a greater accumulated metric.

Reference is made to FIG. 8, if $m_{prev,0}$ (or $m_{prev,1}$) is equal to the default value $m_{preset}$ (i.e., step S710 is positive), its corresponding branch b0 (or b1) will not be selected; as a result, the Viterbi decoding circuit 510 further sets the accumulated metric (i.e., $m_{accum,0}$ or $m_{accum,1}$) corresponding to the target branch, which in this instance is one of the branches of the target state (i.e., the branch b0 or branch b1), to the default value $m_{preset}$ (step S715) and then determines the branch (step S760). If only one branch is equal to the default value $m_{preset}$, the Viterbi decoding circuit 510 selects the other branch in step S760. If the accumulated metrics corresponding to the two branches are equal, the Viterbi decoding circuit 510 can select either branch in step S760.

If step S710 is negative, the flow proceeds to step S720, in which whether the information bit of the auxiliary data A' is known is determined. If, for example, the auxiliary data A' has multiple information bits ($A'_0, A'_1, A'_2, \ldots, A'_{k-1}, A'_k, A'_{k+1}, \ldots$), then whether branch b0 or branch b1 will be selected is highly relevant to the value of information bit $A'_{k-1}$.

When the information bit $A'_{k-1}$ is unknown (step S720 is negative), the Viterbi decoding circuit 510 calculates the current metric of each branch (step S740), calculates the accumulated metrics according to the equations (1) and (2) (S750), and then determines the branch (step S760). After step S760 is complete, the Viterbi decoding circuit 510 executes the flow of FIG. 7 again to process the unprocessed state(s) of the same stage or proceed to the next stage.

When the information bit $A'_{k-1}$ is known (step S720 is positive), the Viterbi decoding circuit 510 determines whether the target state is a candidate state (step S730). Assuming in FIG. 8 that the branch depicted by a dotted line corresponds to a logic 0 and the branch depicted by a solid line corresponds to a logic 1, when the information bit $A'_{k-1}$ is a logic 0, the states $S_{00}$ and $S_{01}$ are the candidate states (step S730 is positive because the current target state is state So1); when the information bit $A'_{k-1}$ is a logic 1, the states $S_{10}$ and $S_{11}$ are the candidate states (step S730 is negative because the current target state is state So1). That is, the Viterbi decoding circuit 510 can exclude or eliminate half of the states in a certain stage based on the value of the information bit of the auxiliary data A'.

When the target state is the candidate state (step S730 is positive), the Viterbi decoding circuit 510 performs step S740 to $S_{760}$. When the target state is not the candidate state (step S730 is negative), the Viterbi decoding circuit 510 performs step S715. More specifically, when determining that the target state will not be selected (i.e., the target state is not a candidate state), the Viterbi decoding circuit 510 sets the accumulated metrics corresponding to the target branches, which in this instance are all branches of the target state (i.e., branches b0 and b1), to the default value $m_{preset}$ (step S715). Then in step S760 the Viterbi decoding circuit 510 can select either the branch b0 or branch b1 as the branch of the target state $S_{01}$ of stage k. Regardless of whether branch b0 or b1 is selected by the Viterbi decoding circuit 510 in step S760, the Viterbi algorithm in the end will not select the survivor path containing the state So1 (that is, both branches b0 and b1 of this state So1 can be regarded as having been excluded or eliminated) because the accumulated metrics of all the branches of the target state $S_{01}$ have been set to the default value $m_{preset}$.

In the embodiment of FIGS. 5-7, the Viterbi decoding circuit 510 refers to the auxiliary data A' to perform decoding. When the information bit(s) of the auxiliary data A' is/are known, there is a chance (depending on whether the target state is a candidate state) that the Viterbi decoding circuit 510 immediately sets the accumulated metrics of all branches of the target state to the default value $m_{preset}$ according to the information bit (i.e., performing step S715) to reduce the calculation burden (i.e., skipping steps S740 to S750). In comparison, the Viterbi decoding circuit 340 of FIG. 3 performs steps S740-S760 for each state. Since steps S710, S715, S720, and S730 of FIG. 7 involve merely simple operations (such as determination or setting values), the circuit complexity of the convolutional code decoder 250 of FIG. 5 is similar to that of the convolutional code decoder 250 of FIG. 3. Compared with the embodiment of FIGS. 3-4, the embodiment of FIGS. 5-7 can further improve the performance of the convolutional code decoder 250 to further shorten the demodulation and/or decoding time at the receiving end of the wireless communication system.

Figure 9:
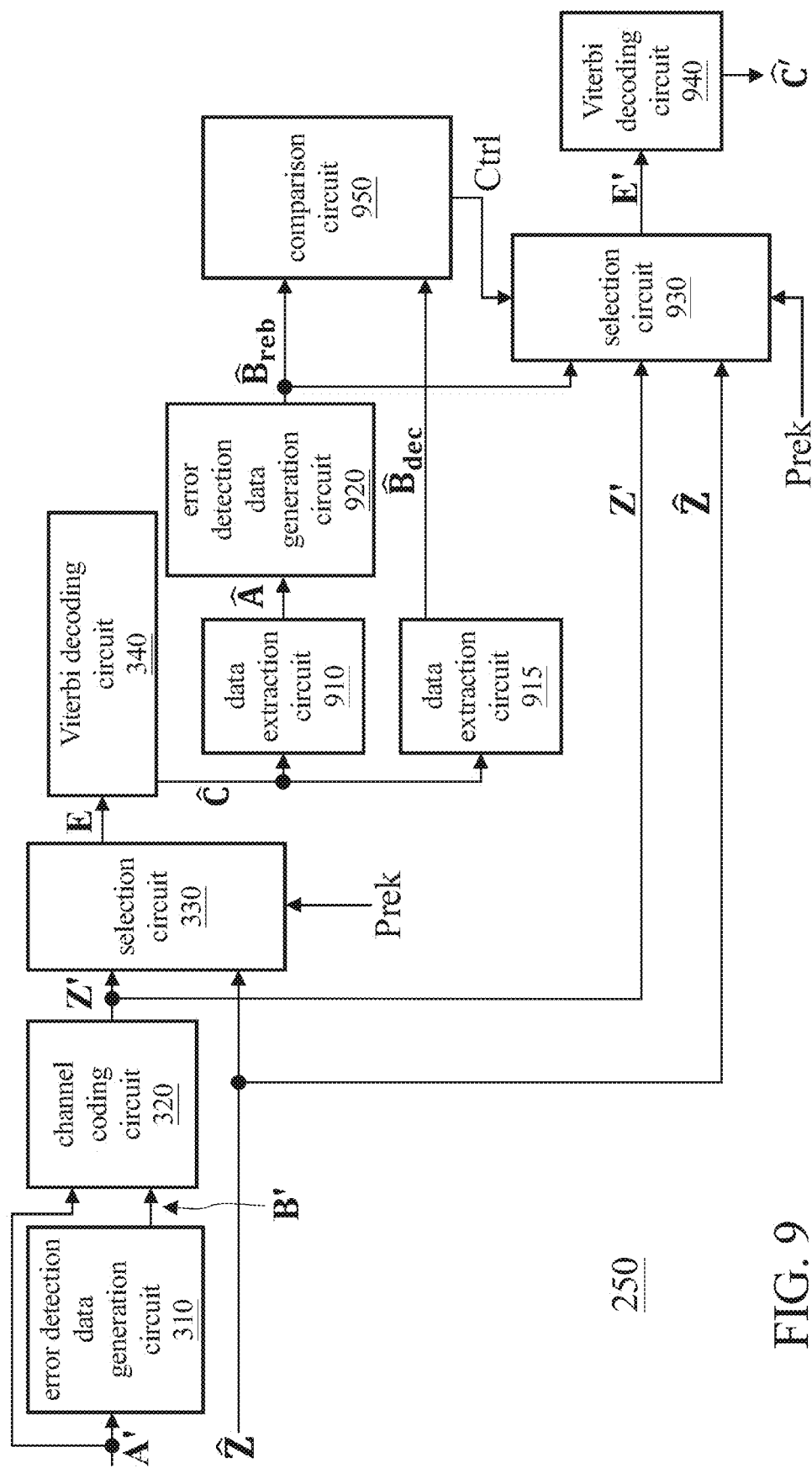
FIG. 9 illustrates a functional block diagram of a convolutional code decoder according to another embodiment of the present invention.
Figure 10:
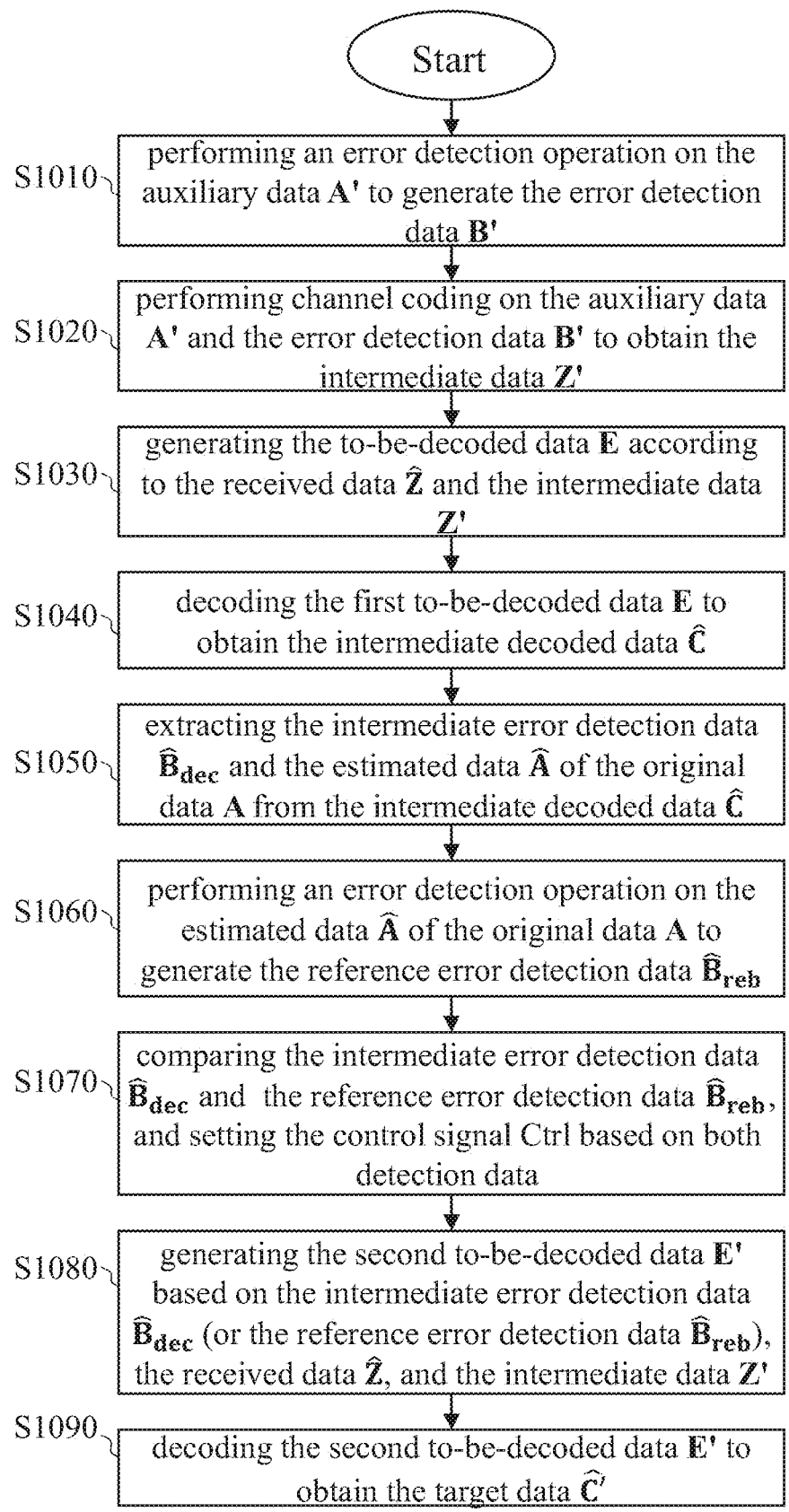
FIG. 10 illustrates a flowchart of a convolutional code decoding method according to another embodiment of the present invention.

FIG. 9 is a functional block diagram of a convolutional code decoder according to another embodiment of the present invention. FIG. 10 is a flowchart of a convolutional code decoding method according to another embodiment of the present invention. The convolutional code decoder 250 includes the error detection data generation circuit 310, the channel coding circuit 320, the selection circuit 330, the Viterbi decoding circuit 340, a data extraction circuit 910, a data extraction circuit 915, an error detection data generation circuit 920, a selection circuit 930, and a Viterbi decoding circuit 940, and a comparison circuit 950. The error detection data generation circuit 310, the channel coding circuit 320, the selection circuit 330, and the Viterbi decoding circuit 340 performs steps S1010, S1020, S1030 and S1040, respectively. These components and steps were discussed in the descriptions of the embodiment of FIGS. 3 and 4 and the details of these components and steps are thus omitted for brevity. The intermediate decoded data $\hat{C}$, which is generated by the Viterbi decoding circuit 340, includes the estimated data $\hat{A}$ and intermediate error detection data $\hat{B}_{dec}$. The intermediate error detection data $\hat{B}_{dec}$ can be used to determine whether the estimated data $\hat{A}$ is a valid codeword. The data extraction circuit 910 and the data extraction circuit 915 respectively extract the estimated data $\hat{A}$ and the intermediate error detection data $\hat{B}_{dec}$ from the intermediate decoded data C (step S1050). Since the intermediate error detection data $\hat{B}_{dec}$ has a predetermined length and is added to the end of the estimated data $\hat{A}$, the data extraction circuit 910 and the data extraction circuit 915 can simply complete the step S1050 by dividing the intermediate decoded data $\hat{C}$.

Since in the first to-be-decoded data E all bits corresponding to the error detection data are unknown (unless all bits of the auxiliary data A' are known) and continuously distributed, and the Viterbi algorithm performs poorly when addressing continuous errors, the error rate of the intermediate error detection data $\hat{B}_{dec}$ is higher than that of the estimated data $\hat{A}$. In other words, the high accuracy of the estimated data $\hat{A}$ is beneficial for the decoding of the error detection data. Thus, the error detection data generation circuit 920 then performs an error detection operation on the estimated data $\hat{A}$ to generate the reference error detection data $\hat{B}_{reb}$ (step S1060). The function of the error detection data generation circuit 920 is the same as that of the error detection data generation circuit 310, and the detail of the error detection data generation circuit 920 is omitted for brevity. Since the reference error detection data $\hat{B}_{reb}$ is rebuilt based on the estimated data $\hat{A}$, the accuracy of the reference error detection data $\hat{B}_{reb}$ is in general higher than that of the intermediate error detection data $\hat{B}_{dec}$. The reference error detection data $\hat{B}_{reb}$ and the intermediate error detection data $\hat{B}_{dec}$ have the same number of bits.

The comparison circuit 950 compares the reference error detection data $\hat{B}_{reb}$ with the intermediate error detection data $\hat{B}_{dec}$ and generates a control signal Ctrl. In one embodiment, the number of bits of the control signal Ctrl is the same as the number of bits of the reference error detection data $\hat{B}_{reb}$ and the number of bits of the intermediate error detection data $\hat{B}_{dec}$. Accordingly, in determining the content of the control signal Ctrl, the comparison circuit 950 can set the bit whose value in the reference error detection data $\hat{B}_{reb}$ is the same as that in the intermediate error detection data $\hat{B}_{dec}$ as a known information bit (e.g., by setting the corresponding bit in the control signal Ctrl to a logic 1), and set the bit whose value in the reference error detection data $\hat{B}_{reb}$ is different from that in the intermediate error detection data $\hat{B}_{dec}$ as an unknown information bit (e.g., by setting the corresponding bit in the control signal Ctrl to a logic 0) (step S1070). In a case where the number of bits whose values in the reference error detection data $\hat{B}_{reb}$ are different from those in the intermediate error detection data $\hat{B}_{dec}$ is smaller than a certain threshold (e.g., the number of logic 0s in the control signal Ctrl is smaller than the threshold), which implies that errors caused by noises may have occurred to the Viterbi decoding circuit 340 in decoding the intermediate error detection data $\hat{B}_{dec}$, the selection circuit 930 refers to the control signal Ctrl and the control signal Prek to generate the second to-be-decoded data E' based on the intermediate error detection data $\hat{B}_{dec}$ (or the reference error detection data $\hat{B}_{reb}$), the received data $\hat{Z}$, and the intermediate data Z' (step S1080). In an alternative case where the number of bits whose values in the reference error detection data $\hat{B}_{reb}$ are different from those in the intermediate error detection data $\hat{B}_{dec}$ is not smaller than the threshold (e.g., the number of logic 0s in the control signal Ctrl is not smaller than the threshold), the selection circuit 930 refers only to the received data Z and the intermediate data Z' to generate the second to-be-decoded data E'.

In some embodiments, the control signal Prek, the control signal Ctrl, the intermediate data Z', and the received data Z have the same number of bits. A logic 1 in the control signal Prek indicates that the corresponding bit in the intermediate data Z' is known, whereas a logic 0 indicates that the corresponding bit in the intermediate data Z' is unknown. A logic 1 in the control signal Ctrl indicates that the corresponding bits in the intermediate error detection data $\hat{B}_{dec}$ and the reference error detection data $\hat{B}_{reb}$ are known, whereas a logic 0 indicates that the corresponding bits in the intermediate error detection data $\hat{B}_{dec}$ and the reference error detection data $\hat{B}_{reb}$ are unknown. Therefore, based on the contents of the control signal Prek and the control signal Ctrl (e.g., based on the result of the bitwise OR operation of the two), the selection circuit 930 can determine the bit values of a second to-be-decoded data E' in the following manner: for the bits that correspond to the error detection data, the selection circuit 930 uses the bit whose value in the intermediate error detection data $\hat{B}_{dec}$ is the same as its value in the reference error detection data $\hat{B}_{reb}$ to replace the corresponding bit in the received data Z; for the bits that do not correspond to the error detection data, the selection circuit 930 uses the bit that is known in the intermediate data Z' to replace the corresponding bit in the received data $\hat{Z}$. As a result, the selection circuit 930 generates the second to-be-decoded data E'. In other words, if the control signal Ctrl and/or the control signal Prek indicates that a certain bit of the received data $\hat{Z}$ has a corresponding predicted value, the selection circuit 930 replaces the value of that bit with the corresponding predicted value. If, on the other hand, the control signal Ctrl and/or the control signal Prek indicates that a certain bit of the received data $\hat{Z}$ is unknown (i.e., not predicted), the selection circuit 930 selects the value in the received data $\hat{Z}$ for that bit.

Finally, the Viterbi decoding circuit 940 decodes the second to-be-decoded data E' to obtain the target data $\hat{C}'$ (step S1090). The selection circuit 930 can be implemented with a multiplexer. Note that in other embodiments some of the steps in FIG. 10 may be carried out sequentially (rather than parallelly); in this way, the convolutional code decoder 250 of FIG. 9 may use only one error detection data generation circuit, only one selection circuit, and only one Viterbi decoding circuit to thereby save cost.

Since the rebuilt reference error detection data $\hat{B}_{reb}$ has high accuracy, which enables the embodiment of FIGS. 9 and 10 to reduce successive error bits in the to-be-decoded data, the decoding performance of the Viterbi algorithm can be improved to thereby shorten the demodulation and/or decoding time at the receiving end of the wireless communication system.

The aforementioned circuits (i.e., the functional blocks of FIGS. 3, 5 and 9) can also be implemented by a digital signal processor (DSP). Specifically, the DSP utilizes a plurality of functional modules to respectively implement the functions of the foregoing circuits, and the DSP executes the codes or program instructions stored in the memory to realize the functions of these functional modules. The invention may also be a combination of hardware and software/firmware.

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention. In addition, although the foregoing embodiments are illustrated based on the NB-IoT, those skilled in the art can appropriately apply the present invention to other types of communication systems in accordance with the disclosure of the present invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A convolutional code decoder which performs decoding, according to a received data and an auxiliary data, to obtain a target data, the convolutional code decoder comprising:

an error detection data generation circuit configured to perform an error detection operation on the auxiliary data to obtain an error detection data;

a channel coding circuit coupled to the error detection data generation circuit and configured to perform channel coding on the auxiliary data and the error detection data to obtain an intermediate data;

a selection circuit coupled to the channel coding circuit and configured to generate a to-be-decoded data according to the received data and the intermediate data; and a Viterbi decoding circuit coupled to the selection circuit and configured to decode the to-be-decoded data to obtain the target data.

2. The convolutional code decoder of claim 1, wherein the intermediate data has the same length as the received data.

3. The convolutional code decoder of claim 1, wherein the intermediate data comprises a plurality of known bits, and the selection circuit uses the known bits to replace corresponding bits of the received data to generate the to-be-decoded data.

4. The convolutional code decoder of claim 1, wherein the error detection data is a first error detection data, the received data is a result of encoding an original data and a second error detection data in accordance with convolutional code, the second error detection data is utilized to verify the correctness of the original data, and multiple known bits of the auxiliary data are the same as the corresponding bits of the original data.

5. A convolutional code decoding method which performs decoding, according to a received data and an auxiliary data, to obtain a target data, the convolutional code decoding method comprising:
performing an error detection operation on the auxiliary data to obtain an error detection data;
performing channel coding on the auxiliary data and the error detection data to obtain an intermediate data;
generating a to-be-decoded data according to the received data and the intermediate data; and
decoding the to-be-decoded data by performing the Viterbi decoding operation to thereby obtain the target data.

6. The convolutional code decoding method of claim 5, wherein the intermediate data has the same length as the received data.

7. The convolutional code decoding method of claim 5, wherein the intermediate data comprises a plurality of known bits, and the step of generating the to-be-decoded data according to the received data and the intermediate data uses the known bits to replace corresponding bits of the received data to generate the to-be-decoded data.

8. The convolutional code decoding method of claim 5, wherein the error detection data is a first error detection data, the received data is a result of encoding an original data and a second error detection data in accordance with convolutional code, the second error detection data is utilized to verify the correctness of the original data, and multiple known bits of the auxiliary data are the same as the corresponding bits of the original data.

9. The convolutional code decoding method of claim 5, wherein the step of decoding the to-be-decoded data by performing the Viterbi decoding operation to thereby obtain the target data refers to the auxiliary data.

10. The convolutional code decoding method of claim 9, wherein the Viterbi decoding operation processes a plurality of states, and a target state of the states comprises a first branch and a second branch, the step of performing the Viterbi decoding operation on the to-be-decoded data by referring to the auxiliary data comprising:
determining, according to whether an information bit in the auxiliary data corresponding to the target state is known, whether to calculate a first metric of the first branch and a second metric of the second branch, or to select one of the first branch and the second branch as a survivor path of the Viterbi algorithm without calculating the first metric and the second metric.

11. The convolutional code decoding method of claim 10, wherein the step of performing the Viterbi decoding operation on the to-be-decoded data by referring to the auxiliary data comprises:
determining whether the target state is a candidate state according to the information bit when the information bit is known;
calculating the first metric of the first branch and the second metric of the second branch when the target state is the candidate state; and
selecting one of the first branch and the second branch as the survivor path without calculating the first metric and the second metric when the target state is not the candidate state.

12. The convolutional code decoding method of claim 11, wherein the step of performing the Viterbi decoding operation on the to-be-decoded data by referring to the auxiliary data further comprises:
setting a first accumulated metric of the Viterbi algorithm corresponding to the first branch and a second accumulated metric of the Viterbi algorithm corresponding to the second branch to a default value when the target state is not the candidate state, so that the Viterbi algorithm does not select the survivor path.

13. A convolutional code decoder which performs decoding, according to a received data and an auxiliary data, to obtain a target data, the convolutional code decoder comprising:
an error detection data generation circuit configured to perform an error detection operation on the auxiliary data to obtain an error detection data;
a channel coding circuit coupled to the error detection data generation circuit and configured to perform channel coding on the auxiliary data and the error detection data to obtain an intermediate data;
a selection circuit coupled to the channel coding circuit and configured to generate a to-be-decoded data according to the received data and the intermediate data; and
a Viterbi decoding circuit coupled to the selection circuit and configured to decode the to-be-decoded data by referring to the auxiliary data to obtain the target data.

14. The convolutional code decoder of claim 13, wherein the Viterbi decoding circuit processes a plurality of states, and a target state of the states comprises a first branch and a second branch, the Viterbi decoding circuit being configured to
determine, according to whether an information bit in the auxiliary data corresponding to the target state is known, whether to calculate a first metric of the first branch and a second metric of the second branch, or to select one of the first branch and the second branch as a survivor path of the Viterbi algorithm without calculating the first metric and the second metric.

15. The convolutional code decoder of claim 14, wherein the Viterbi decoding circuit is configured to further
determine whether the target state is a candidate state according to the information bit when the information bit is known;
calculate the first metric of the first branch and the second metric of the second branch when the target state is the candidate state; and
select one of the first branch and the second branch as the survivor path without calculating the first metric and the second metric when the target state is not the candidate state.

16. The convolutional code decoder of claim 15, wherein the Viterbi decoding circuit is configured to further
set a first accumulated metric of the Viterbi algorithm corresponding to the first branch and a second accumulated metric of the Viterbi algorithm corresponding to the second branch to a default value when the target state is not the candidate state, so that the Viterbi algorithm does not select the survivor path.

* * * * *